United States Patent [19]

Munse

[11] 4,103,400

[45] Aug. 1, 1978

[54] DART CLIP

[75] Inventor: Robert A. Munse, Troy, Mich.

[73] Assignee: Microdot Inc., Greenwich, Conn.

[21] Appl. No.: 818,510

[22] Filed: Jul. 25, 1977

[51] Int. Cl.² ............... A44B 21/00; B60R 13/02
[52] U.S. Cl. ............................... 24/73 MF; 52/717
[58] Field of Search ........... 52/717; 293/1, 60, 62, 293/71 R, 88; 24/73 HS, 73 MF, 73 MS, 73 PM, 73 CM, 73

[56] References Cited

U.S. PATENT DOCUMENTS

| 2,178,719 | 11/1939 | Cotter | 24/73 MF |
| 2,322,656 | 6/1943 | Murphy | 52/717 X |
| 2,327,328 | 8/1943 | Murphy | 52/717 X |
| 2,329,688 | 9/1943 | Bedford | 52/717 |
| 2,414,986 | 6/1947 | Tinnerman | 24/73 MF |

Primary Examiner—Louis K. Rimrodt
Attorney, Agent, or Firm—Harness, Dickey & Pierce

[57] ABSTRACT

The disclosure relates to a dart clip for retaining a resilient trim and impact strip on a vehicle bumper.

4 Claims, 3 Drawing Figures

DART CLIP

BACKGROUND OF THE INVENTION

While clips having a "Christmas tree" configuration are well known, as shown in U.S. Pat. Nos. 2,026,585; 2,055,427; 2,086,288; 2,198,186; 2,258,742; 2,332,852 and 3,059,299, the ability of such clips to retain a resilient element upon the occurence of relatively heavy impact loads is limited. The principle source of failure is the interface between the clip and the member being retained.

SUMMARY OF THE INVENTION

The invention relates to the geometry of the end portions of a dart clip which are re-entrantly folded as to present a flat edge to the member being retaining. The re-entrant end portions present relatively small bending moments to insure against opening and failure.

DESCRIPTION OF THE PREFERRED EMBODIMENT

Figure 1:
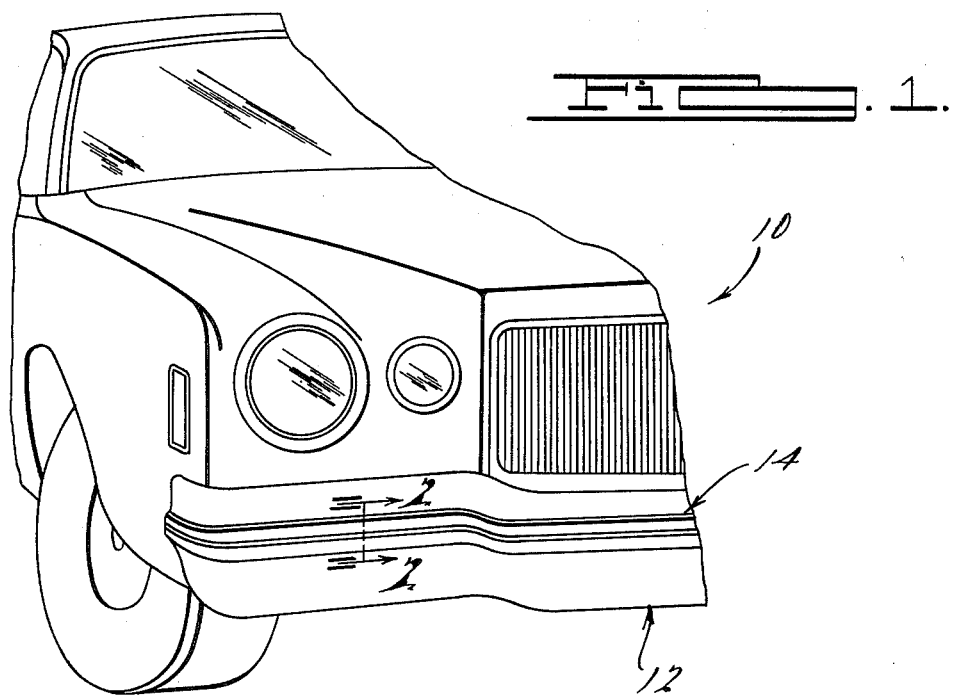
FIG. 1 is a broken perspective view of a motor vehicle having a bumper strip attached thereto by the clip of the instant invention.
Figure 2:
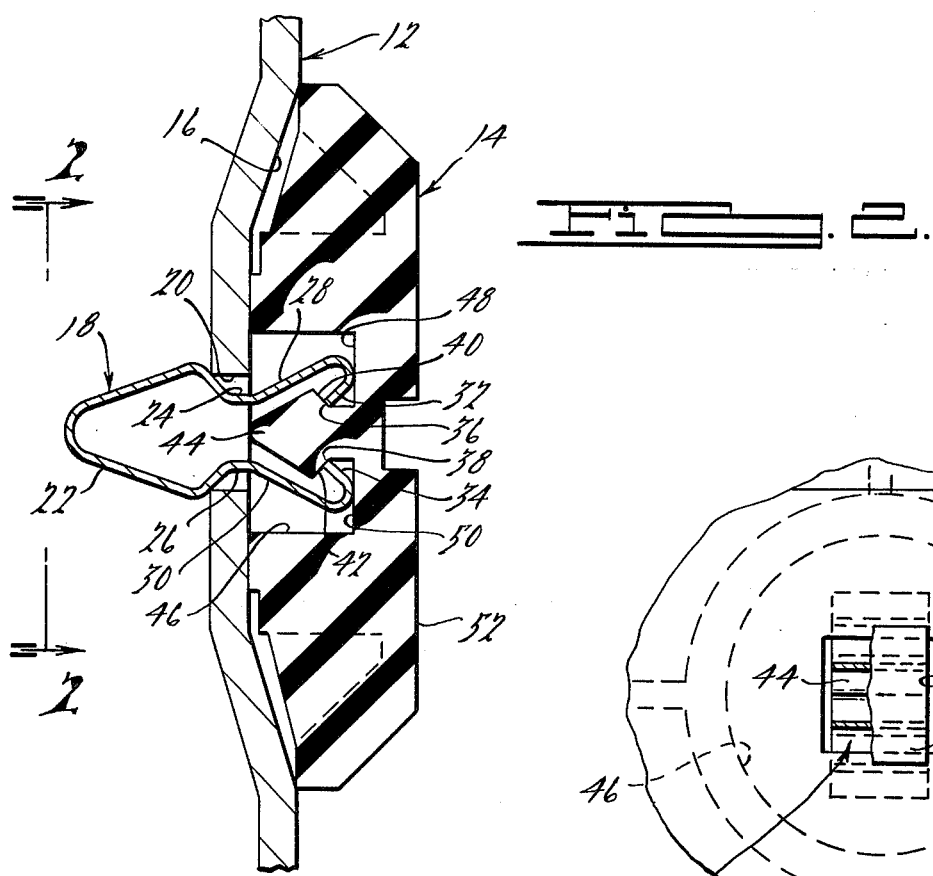
FIG. 2 is a cross-sectional view taken substantially along the line 2—2 of FIG. 1.
Figure 3:
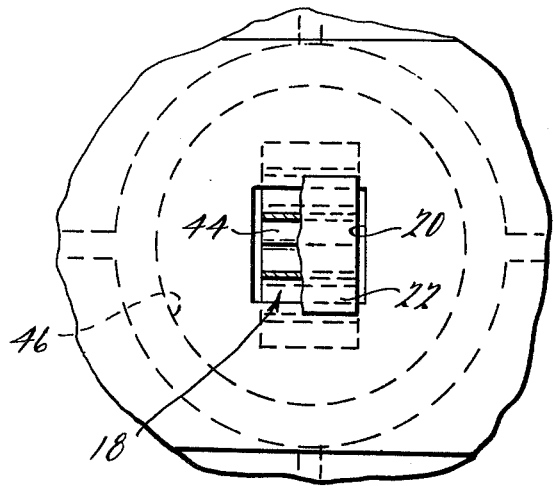
FIG. 3 is a view taken along the line 3—3 of FIG. 2.

A motor vehicle 10 is provided with a conventional bumper 12 having a rubber or plastic composition impact strip 14 thereon. The impact strip 14 may be positioned in a complementary recess 16 in the bumper 12. The bumper strip 14 is secured to the bumper 12 by an improved dart clip 18 which is configured to penetrate and be retained within an aperture 20 in the bumper 12. A plurality of dart clips 18 are provided along the length of the bumper strip 14 to retain the bumper strip on the bumper 12. The dart clips 18 are similar in construction and, for the purposes of simplicity, only one dart clip 18 will be described hereafter.

In accordance with the present invention, the dart clip 18 comprises an arrow-shaped front portion 22 having inwardly directed concave undulations 24 and 26 which function to lock the clip 18 within the aperture 20 in the bumper 12 and cam the clip 18 and strip 14 toward the assembled condition. Rearmost leg portions 28 and 30 are provided with re-entrantly folded locking end portions 32 and 34 having end faces 36 and 38 which seat against complementary surfaces 40 and 42 on an arrow-shaped projection 44 of the bumper strip 14. A recess 46 is formed in the bumper strip 14 to accommodate the leg portions 28 and 30 of the clip 18. It is to be noted that the re-entrant portions 32 and 34 on the legs 28 and 30, respectively, on the clip 18 bear against internal wall portions 48 and 50 of the recess 46 whereby pressure on an outer face 52 of the strip 14 forces the clip 18 through the aperture 20 in the bumper 12 for assembly purposes.

The re-entrant folds 32 and 34 on the leg portions 28 and 30 on the clip 18 materially strengthen the end portions of the leg portions as well as providing seating faces 36 and 38 that bear in flat juxtaposed relation on the surfaces 40 and 42 of the arrow-shaped portion 44 of the bumper strip 14. In this manner, strength of the clip 18 is maximized and holding pressure of the clip on the bumper strip is transferred without a cutting or tearing force on the strip. Breakaway forces on the strip 14 do not unfold or bend the end portions 32 and 34 due to the fact that the end portions extend generally parallel to the legs 28 and 30, respectively. Moreover, because the end 32 and 34 extend toward one another to grip the projection 44, compression of the front portion 22 due to a retraction force effects an increased gripping force of the ends 32 and 34 on the projection 44.

While it will be apparent that the invention herein disclosed is well calculated to achieve the benefits and advantages as hereinabove set forth, it will be appreciated that the invention is susceptible to modification, variation and change without departing from the spirit thereof.

I claim:

1. A dart clip for the retention of a first member having an arrow-shaped projection thereon to a second member having an aperture therein, said clip comprising a spring metal strip folded to a generally V-shaped configuration, the leg portions of said clip having end portions re-entrantly folded toward each other for gripping engagement with said first member, said end portions having end faces which bear in flat juxtaposed relation against complementary surfaces on said arrow-shaped projection.

2. A clip in accordance with claim 1 wherein the leg portions thereof have concave undulations therein for locking engagement within the aperture in said second member.

3. A clip in accordance with claim 2 wherein retraction of said clip from within said aperture results in camming of said leg portions toward one another to increase the holding force of said end portions on said first member.

4. A clip in accordance with claim 1 wherein each of said leg portions has an end portion extending generally parallel thereto.

* * * * *